(12) United States Patent
Trivedi

(10) Patent No.: US 8,138,073 B2
(45) Date of Patent: Mar. 20, 2012

(54) METHOD FOR FORMING A SCHOTTKY DIODE HAVING A METAL-SEMICONDUCTOR SCHOTTKY CONTACT

(75) Inventor: Vishal P. Trivedi, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 147 days.

(21) Appl. No.: 12/766,395

(22) Filed: Apr. 23, 2010

(65) Prior Publication Data

US 2011/0263112 A1 Oct. 27, 2011

(51) Int. Cl.
*H01L 21/28* (2006.01)

(52) U.S. Cl. .................. 438/571; 257/E21.359

(58) Field of Classification Search .................. 438/571, 438/570, 582, 583, 576, 169
See application file for complete search history.

*Primary Examiner* — Charles Garber
*Assistant Examiner* — Reema Patel
(74) *Attorney, Agent, or Firm* — Daniel D. Hill

(57) ABSTRACT

A method for forming a metal-semiconductor Schottky contact in a well region is provided. The method includes forming a first insulating layer overlying a shallow trench isolation in the well region; and removing a portion of the first insulating layer such that only the well region and a portion of the shallow trench isolation is covered by a remaining portion of the first insulating layer. The method further includes forming a second insulating layer overlying the remaining portion of the first insulating layer and using a contact mask, forming a contact opening in the second insulating layer and the remaining portion of the first insulating layer to expose a portion of the well region. The method further includes forming the metal-semiconductor Schottky contact in the exposed portion of the well region by forming a metal layer in the contact opening and annealing the metal layer.

20 Claims, 8 Drawing Sheets

METHOD FOR FORMING A SCHOTTKY DIODE HAVING A METAL-SEMICONDUCTOR SCHOTTKY CONTACT

BACKGROUND

1. Field

This disclosure relates generally to semiconductors, and more specifically, to a method for forming a Schottky diode having a metal-semiconductor Schottky contact.

2. Related Art

Various types of diodes can be formed depending on composition and doping profiles. Schottky diodes are typically formed to have a lower threshold voltage in a forward biased operation than a PN junction diode and are useful in a number of different applications. A Schottky diode may have a metal-semiconductor Schottky contact. The metal-semiconductor Schottky contact provides for high frequency operation (30 GHz-300 GHz) because, ideally, a Schottky diode is a majority-carrier device and therefore there is no storage of minority carriers and corresponding diffusion capacitance as in the PN junction diode. Also, a Schottky diode typically has lower flicker noise than a field effect transistor. However, a Schottky diode having a metal-semiconductor Schottky contact that is manufactured in a conventional complementary metal-oxide semiconductor (CMOS) process may require additional processing steps that increase the cost and complexity of a semiconductor device.

Therefore, what is needed is a method for making the Schottky diode having a metal-semiconductor Schottky contact that solves at least some of the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
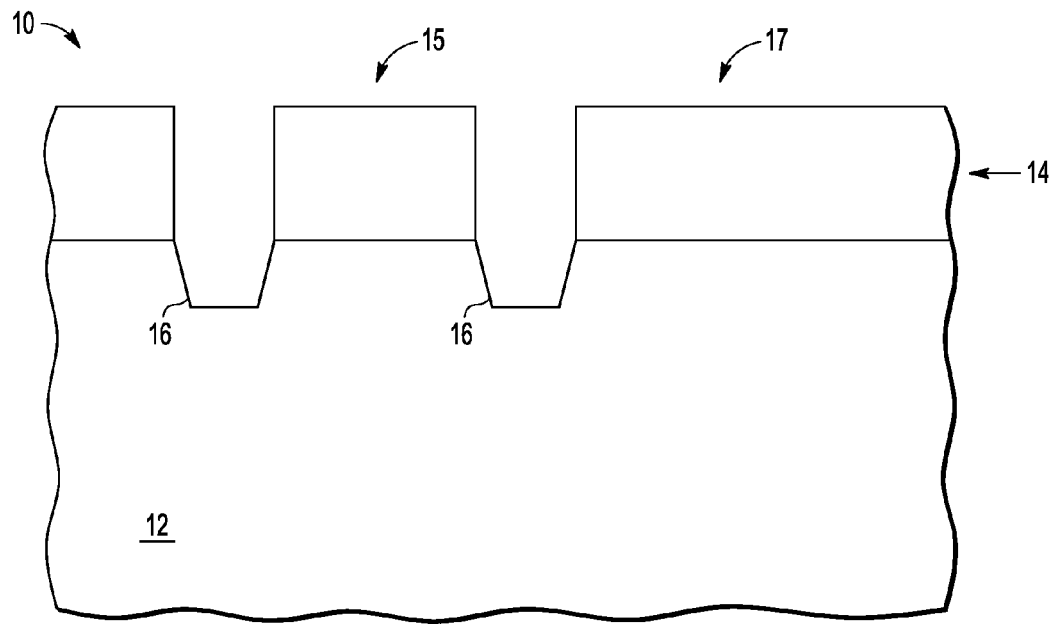
FIGS. 1-9 illustrate cross-sectional views of steps for forming a semiconductor device in accordance with an embodiment.

Generally, there is provided, a method for forming a metal-semiconductor Schottky contact. The metal-semiconductor Schottky contact is formed in a CMOS process without any significant changes to the CMOS process that would increase manufacturing costs. In a CMOS process, the method for forming the metal-semiconductor Schottky contact uses a contact process instead of a silicide process to form the metal-semiconductor Schottky contact. Using the contact process allows a smaller metal to semiconductor junction area for higher frequency operation. Whereas, the silicide process will not generally allow a feature size as small as the feature size of a contact mask because process requirements for substantially all conventional CMOS processes require a silicided area to be larger than a contact area. Also, the materials used in a contact process are typically the same as a CMOS process advances from one generation to the next generation, whereas the materials of a silicide process tends to change with technology scaling. Therefore, a Schottky contact formed using a contact process may provide better scalability than that formed using a silicide process.

In one aspect, there is provided, a method for forming a metal-semiconductor Schottky contact in a well region, the method comprising: forming shallow trench isolation in the well region to form a first well region separated from a second well region by the shallow trench isolation; forming a first insulating layer overlying the shallow trench isolation, the first well region, and the second well region; removing a portion of the first insulating layer such that only the first well region and a portion of the shallow trench isolation is covered by a remaining portion of the first insulating layer; forming a highly doped region in the second well region; siliciding a top portion of the highly doped region to form a silicide layer; forming a second insulating layer overlying the remaining portion of the first insulating layer and the silicide layer; using a contact mask, forming a contact opening in the second insulating layer and the remaining portion of the first insulating layer to expose a portion of the first well region; and forming the metal-semiconductor Schottky contact in the exposed portion of the first well region by forming a metal layer in at least a portion of the contact opening and annealing the metal layer. The metal-semiconductor Schottky contact opening may have a first area and the first well region has a second area, and wherein the first area is smaller than the second area. The method may further comprise: prior to forming the first insulating layer, forming a gate dielectric layer overlying the first well region and the second well region; removing a portion of the gate dielectric layer such that only the first well region and the portion of the shallow trench isolation is covered by a remaining portion of the gate dielectric layer; and using the contact mask, forming the contact opening in the gate dielectric layer to expose the portion of the first well region. The method may further comprise, using the contact mask, forming a second contact opening in the second insulating layer to expose a portion of the silicide layer. The method may further comprise: forming a contact plug in the contact opening by filling the contact opening with a conductive material. The metal layer may comprise titanium and wherein the step of forming the metal-semiconductor Schottky contact comprises using one of either collimated sputtering or ionized metal plasma deposition to form the metal layer in the contact opening. The method may further comprise, prior to siliciding the top portion of the highly doped region, annealing the second well region.

In another embodiment, there is provided, a method for forming a Schottky diode in a well region, the method comprising: forming shallow trench isolation in the well region to form a first well region separated from a second well region by the shallow trench isolation; forming a gate dielectric layer overlying the first well region and second well region; forming a first insulating layer overlying the gate dielectric layer; removing a portion of the first insulating layer and a portion of the gate dielectric layer such that only the first well region and a portion of the shallow trench isolation is covered by a remaining portion of the first insulating layer and a remaining portion of the gate dielectric layer; forming a highly doped region in the second well region; siliciding a top portion of the highly doped region to form a silicide layer; forming a second insulating layer overlying the remaining portion of the first insulating layer and the silicide layer; using a contact mask, forming a contact opening in the second insulating layer, the remaining portion of the first insulating layer, and the remaining portion of the gate dielectric layer to expose a portion of the first well region; forming a metal-semiconductor Schottky contact in the exposed portion of the first well region by forming a metal layer in at least a portion of the contact opening and annealing the metal layer such that the Schottky diode is formed with the metal-semiconductor Schottky contact as an anode and the highly doped region as a cathode. The metal-semiconductor Schottky contact may have a first area and the first well region has a second area, and wherein the first area is smaller than the second area. The method may further comprise, using the contact mask, forming a second contact opening in the second insulating layer to expose a portion of the silicide layer. The method may further comprise forming a contact plug in the contact opening by filling the contact opening with a conductive material. The metal layer may comprise titanium and wherein the step of forming the metal-semiconductor Schottky contact may comprise using one of either collimated sputtering or ionized metal plasma deposition to form the metal layer in the contact opening. The method may further comprise, prior to siliciding the top portion of the highly doped region, annealing the second well region.

In yet another embodiment, there is provided, a method for forming a titanium-silicon Schottky contact in a well region, wherein the well region comprises silicon, the method comprising: forming shallow trench isolation in the well region to form a first well region separated from a second well region by the shallow trench isolation; forming a first insulating layer overlying the shallow trench isolation, the first well region, and the second well region; removing a portion of the first insulating layer such that only the first well region and a portion of the shallow trench isolation is covered by a remaining portion of the first insulating layer; forming a highly doped region in the second well region; siliciding a top portion of the highly doped region to form a silicide layer; forming a second insulating layer overlying the remaining portion of the first insulating layer and the silicide layer; using a contact mask, forming a contact opening in the second insulating layer and the remaining portion of the first insulating layer to expose a portion of the first well region; and forming the titanium-silicon Schottky contact in the exposed portion of the first well region by forming a titanium layer and a titanium-nitride layer in at least a portion of the contact opening and annealing the titanium layer and the titanium-nitride at a predetermined temperature for at least a predetermined duration selected to obtain a low resistance at the titanium-silicon Schottky contact. The titanium-silicon Schottky contact may have a first area and the first well region has a second area, and wherein the first area is smaller than the second area. The method may further comprise: prior to forming the first insulating layer, forming a gate dielectric layer overlying the first well region and the second well region; removing a portion of the gate dielectric layer such that only the first well region and the portion of the shallow trench isolation is covered by a remaining portion of the gate dielectric layer; and using the contact mask, forming the contact opening in the gate dielectric layer to expose the portion of the first well region. The method may further comprise, using the contact mask, forming a second contact opening in the second insulating layer to expose a portion of the silicide layer. The method may further comprise forming a contact plug in the contact opening by filling the contact opening with a conductive material. The step of forming the titanium-silicon Schottky contact may comprise using one of either collimated sputtering or ionized metal plasma deposition to form the titanium layer in the contact opening. The method may further comprise, prior to siliciding the top portion of the highly doped region, annealing the second well region.

FIGS. 1-9 illustrate cross-sectional views of steps for forming semiconductor device 10 in accordance with an embodiment.

FIG. 1 illustrates a cross-section of semiconductor device 10 after a conventional shallow trench isolation (STI) process is used form STI trenches 16 in substrate 12. In the illustrated embodiment, substrate 12 is a silicon substrate. In other embodiments, substrate 12 can be any semiconductor material or combinations of materials, such as gallium arsenide, silicon germanium, silicon-on-insulator (SOI), silicon, monocrystalline silicon, the like, and combinations of the above. Also, in one embodiment, semiconductor device 10 is a Schottky diode. In FIG. 1, an insulating layer 14 comprising a pad oxide and a pad nitride is formed on the surface of substrate 12. Insulating layer 14 is patterned to expose areas where the trenches are to be formed. Trenches 16 are used to electrically separate a Schottky contact well region 15 from other regions of semiconductor device 10, such as ohmic contact well region 17.

Figure 2:
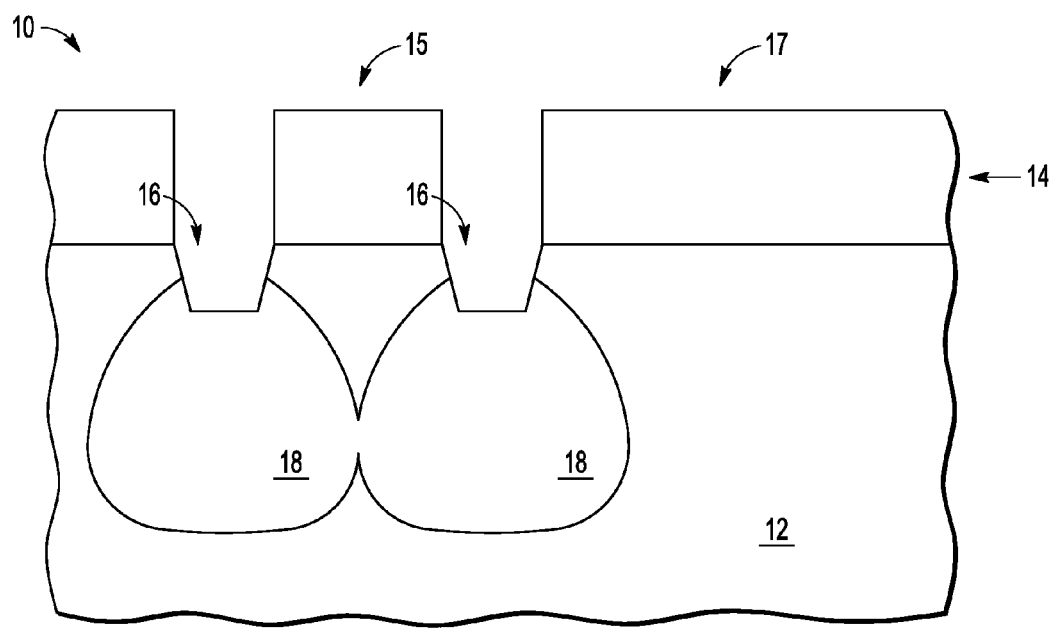

FIG. 2 illustrates a cross-section of semiconductor device 10 after sub-isolation buried layer (SIBL) 18 is formed using masked ion implantation (not shown). In addition to the photoresist mask, patterned insulating layer 14 also functions as a hard mask to block the ion implantation of SIBL 18. SIBL 18 reduces the resistance of a conduction path between Schottky contact well region 15 and Ohmic contact region 17 when forming a Schottky diode.

Figure 3:
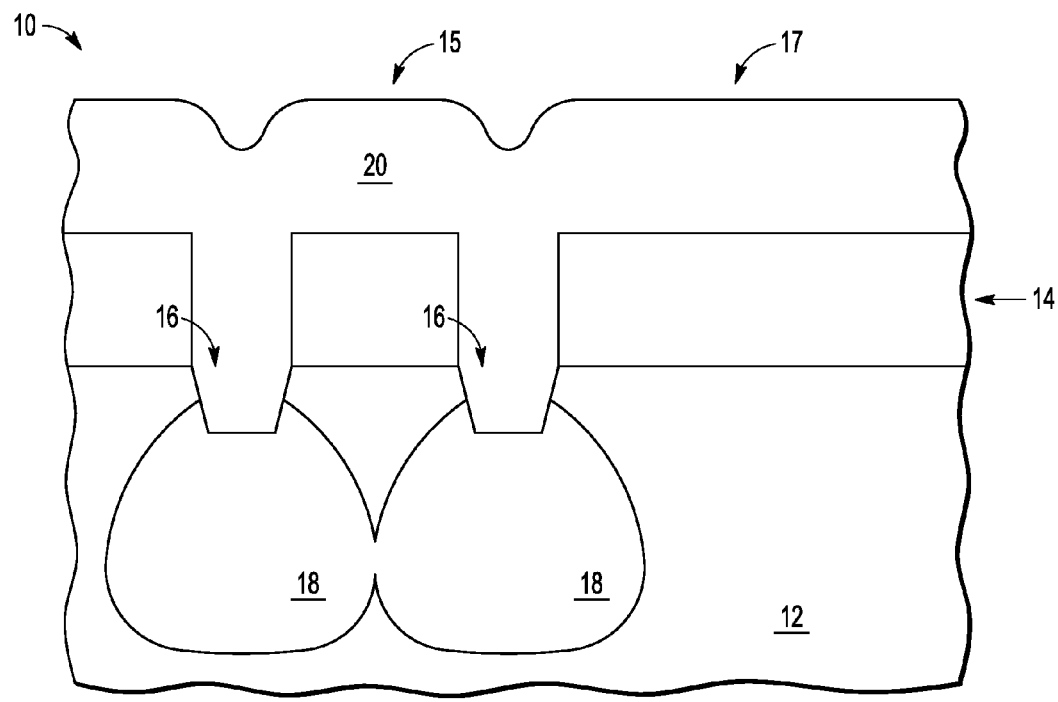

FIG. 3 illustrates a cross-section of semiconductor device 10 after an insulating layer comprising deposited silicon dioxide layer 20 has been formed over device 10 and in trenches 16. A chemical mechanical polish (CMP) process is used to planarize the surface down to the substrate surface, removing most or all of silicon dioxide layer 20 except the portion of silicon dioxide layer 20 that is within trenches 16. The CMP process removes all of insulating layer 14. Note that FIG. 3 does not show the removal of silicon dioxide layer 20 and insulating layer 14. However, the remaining portion of silicon dioxide layer 20 in trenches 16 is illustrated in FIG. 4.

Figure 4:
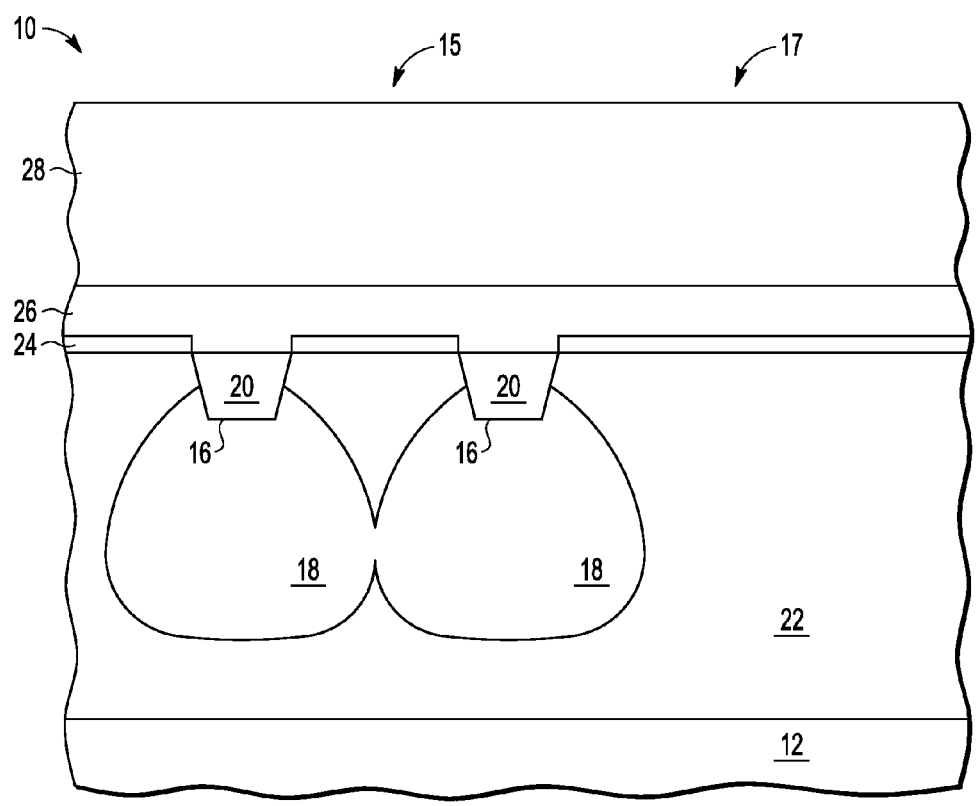

FIG. 4 illustrates a cross-section of semiconductor device 10 after a lightly doped region 22 is implanted into substrate 12 and activated using conventional thermal annealing. In one embodiment, lightly doped region 22 is doped with phosphorous to produce an n-type well (N-well). In another embodiment, lightly doped region 22 is a p-type well (P-well). A doping concentration of lightly doped region 22 for a metal-semiconductor Schottky contact is graded to be lighter (in the range of 5e16-5e17 cm$^{-3}$ and preferably about 1 e17 cm$^{-3}$) near the surface than below the surface. Gate dielectric layer 24 is thermally grown and/or deposited (for example using atomic layer deposition) on the surface of substrate 12 where silicon is exposed. A tetraethyl orthosilicate (TEOS) layer 26 is deposited (for example using chemical vapor deposition (CVD)) on gate dielectric layer 24. A silicon nitride layer 28 is deposited (for example using CVD) on TEOS layer 26. Gate dielectric layer 24 is much (5 to 10 times) thinner than either of layers 26 and 28.

Figure 5:
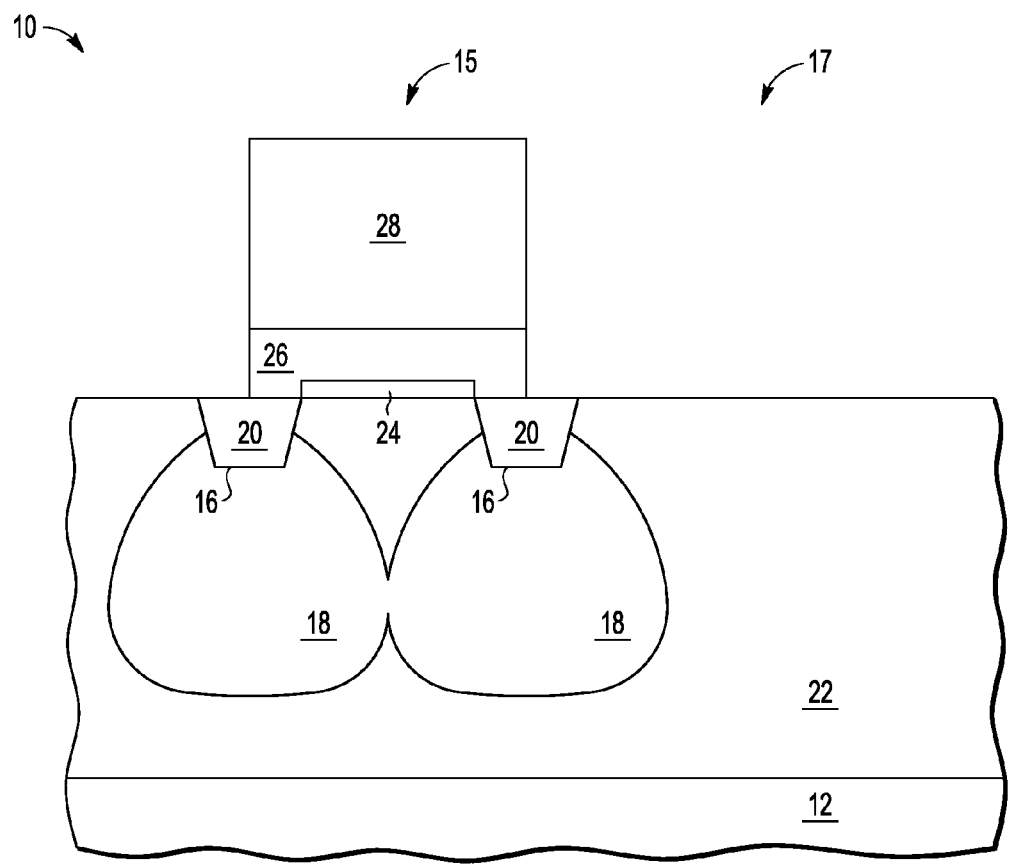

FIG. 5 illustrates a cross-section of semiconductor device 10 after a photoresist layer (not shown) is formed over substrate 12 and then insulating layers comprising a silicon nitride layer 28, TEOS layer 26, and gate dielectric 24 are patterned using conventional reactive ion etching, and the photoresist layer removed. A portion of silicon nitride layer 28, TEOS layer 26, and gate dielectric 24 protect Schottky contact well region 15 during subsequent ion implantation and siliciding steps.

Figure 6:
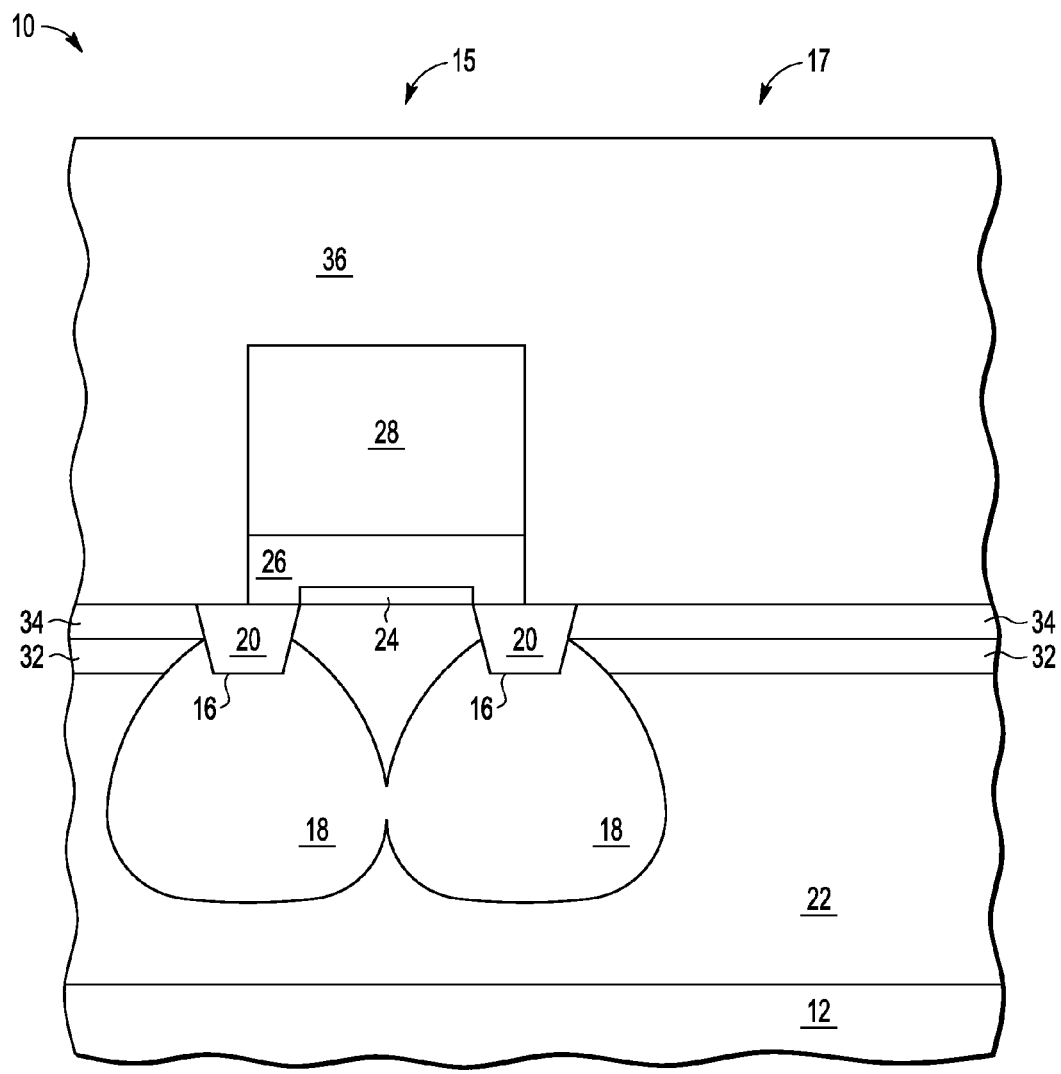

FIG. 6 illustrates a cross-section of semiconductor device 10 after highly doped region 32 is implanted into substrate 12 and activated using conventional thermal annealing. In one embodiment, highly doped region 32 is similar to masked source/drain implants used in the formation of a metal-oxide semiconductor (MOS) transistor. Layer 26 and 28 or a photoresist mask are used to block implantation into the Schottky contact well region 15. Highly doped region 32 will be used to form the ohmic contact for a Schottky diode. After highly doped region 32 is formed, substrate 12 is silicided to produce silicide layer 34. Note that silicide layer 34 is not formed in Schottky contact well region 15. After silicide layer 34 is formed, a first interlayer dielectric (ILD) layer 36 is deposited using, for example, CVD, over the silicide layer 34 and silicon nitride layer 28. ILD layer 36 is then planarized using a CMP process. ILD layer 36 is a bottom, or first insulating layer for a plurality of metal interconnect layers that are formed later using a conventional back-end-of-the-line (BEOL) process.

Figure 7:
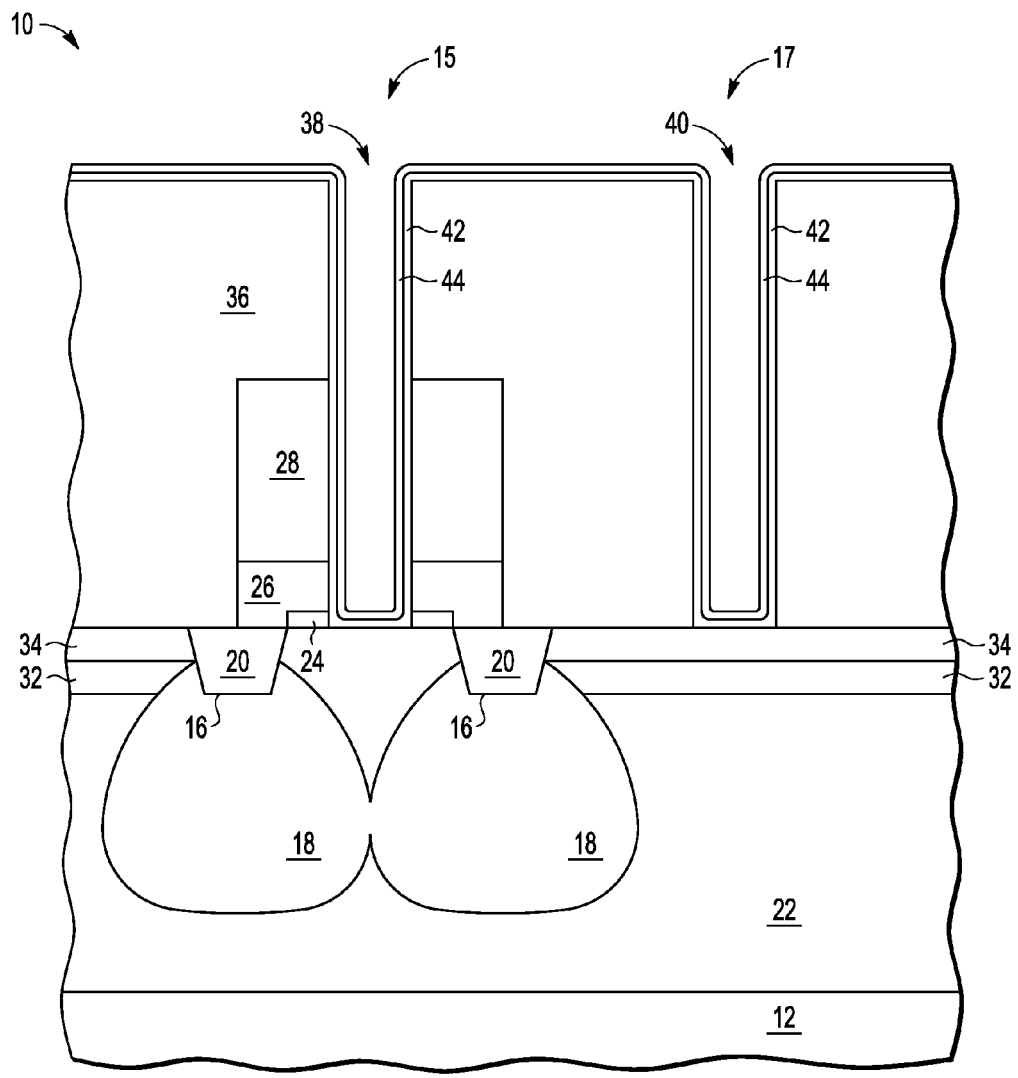

FIG. 7 illustrates a cross-section of semiconductor device 10 after a first portion of a contact process comprising a contact mask (not shown) and reactive ion etching are used to form contact openings, or vias 38 and 40. The contact mask photoresist is removed and a stack of contact glue and/or barrier layer 42 and 44 is deposited. The metal-semiconductor Schottky contact for the Schottky diode will be formed under via 38. The surface area of the Schottky contact is about the same as the contact area of the bottom of via 38. Using a contact mask and a contact process allows a smaller Schottky contact area than if the Schottky contact was formed using a active mask and silicide process because substantially all current CMOS process technologies require silicide surface area to be larger than the area of the via. As can be seen in FIG. 7, the smaller diameter via is much smaller than the area of Schottky contact well region 15 between trenches 20 and provides a smaller area metal-semiconductor Schottky contact for operation at high frequencies (30-300 GHz). In one embodiment, glue layer 42 is a metal comprising titanium and/or titanium-nitride. In another embodiment glue layer 42 may be a barrier layer. To ensure layer 42 is formed directly on the silicon at the bottom of via 38, the titanium may be deposited by collimated sputtering or by using ionized metal plasma deposition. Layer 42 may also cover the sides of vias 38 and 40. The titanium of layer 42 is about 400 Angstroms thick but can be thinner than 150 Angstroms or thicker than 400 Angstroms as allowed by the size of the via openings. Titanium nitride layer 44 is formed preferably using metal-organic CVD on layer 42. Layer 44 is about 250 Angstroms thick, but can be thinner than 60 Angstroms or thicker than 250 Angstroms as allowed by the size of the via openings.

Figure 8:
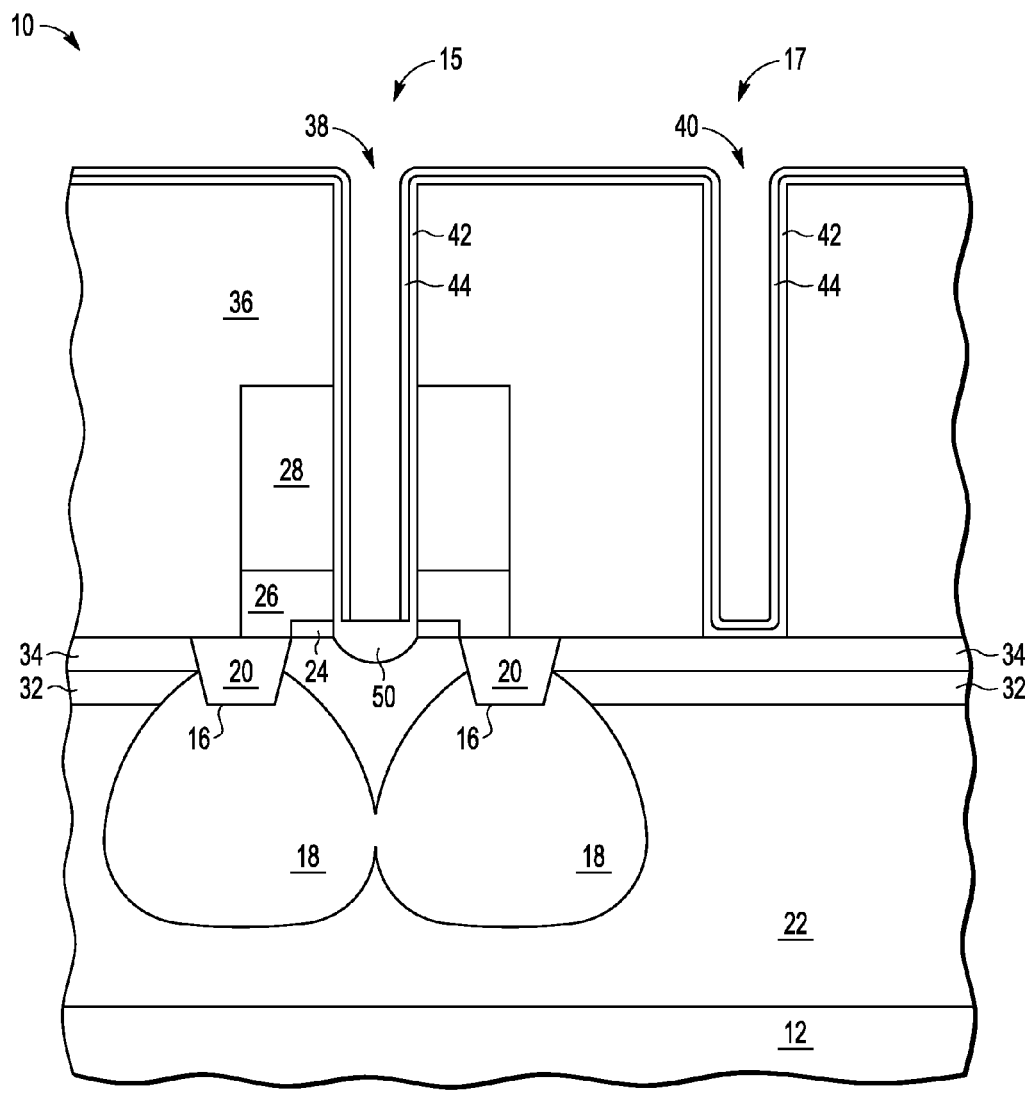

FIG. 8 illustrates a cross-section of semiconductor device 10 after a second portion of the contact process comprising annealing substrate 12 preferably for about 15 seconds at 665 degrees Celsius, forming a layer of titanium silicide 50 in substrate 12 at the bottom of via 38. The titanium silicide is formed as a result of a reaction between the silicon and titanium. Annealing duration and temperature can be varied as long as it provides sufficient energy to support the reaction for forming titanium silicide. The reaction may continue and titanium silicide continue to form if subsequent processing is done at sufficiently high temperature and/or duration. The anneal forms a low-resistance metal-to-metal contact to silicide 34 under via 40 and over silicide 34.

Figure 9:
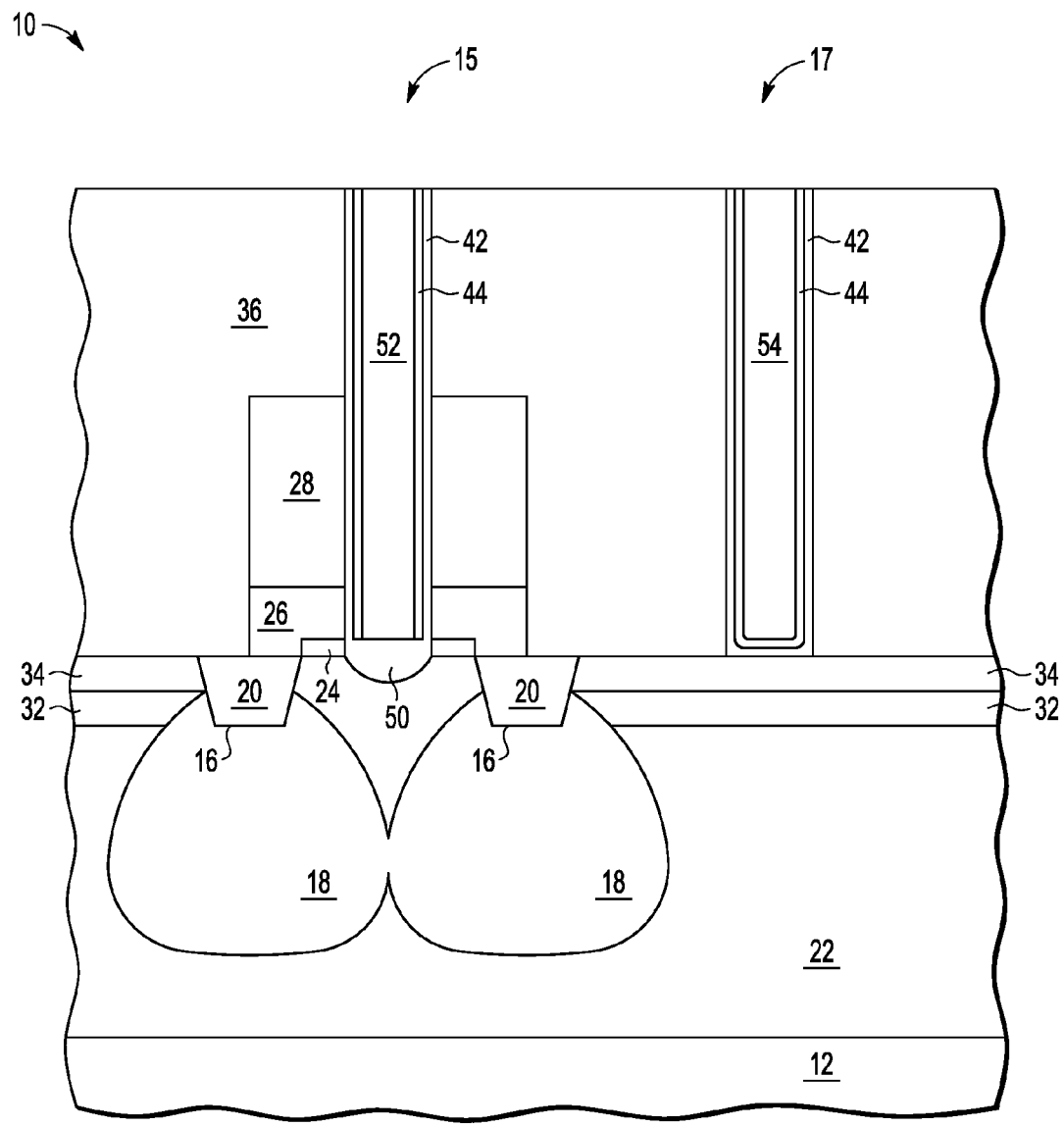

FIG. 9 illustrates a cross-section of semiconductor device 10 after remaining portion of the contact process comprising deposition of tungsten plugs 52 and 54 in vias 38 and 40 and a conventional CMP process to planarize the excess tungsten down to a top surface of ILD 36. The CMP process is used to remove layers 42 and 44 from the top of ILD 36. Standard BEOL processing is then used to complete semiconductor device 10. For example, metal interconnects (not shown) are formed on the surface of ILD 36 and additional ILD layers and metal interconnects are formed in accordance with a conventional interconnect process. After the final, or top, layer of interconnect is formed, a passivation layer may be formed and then a metal cap layer may be formed that comprises pads for externally connecting semiconductor device 10 with, for example, a printed circuit board (PCB).

Figure 10:
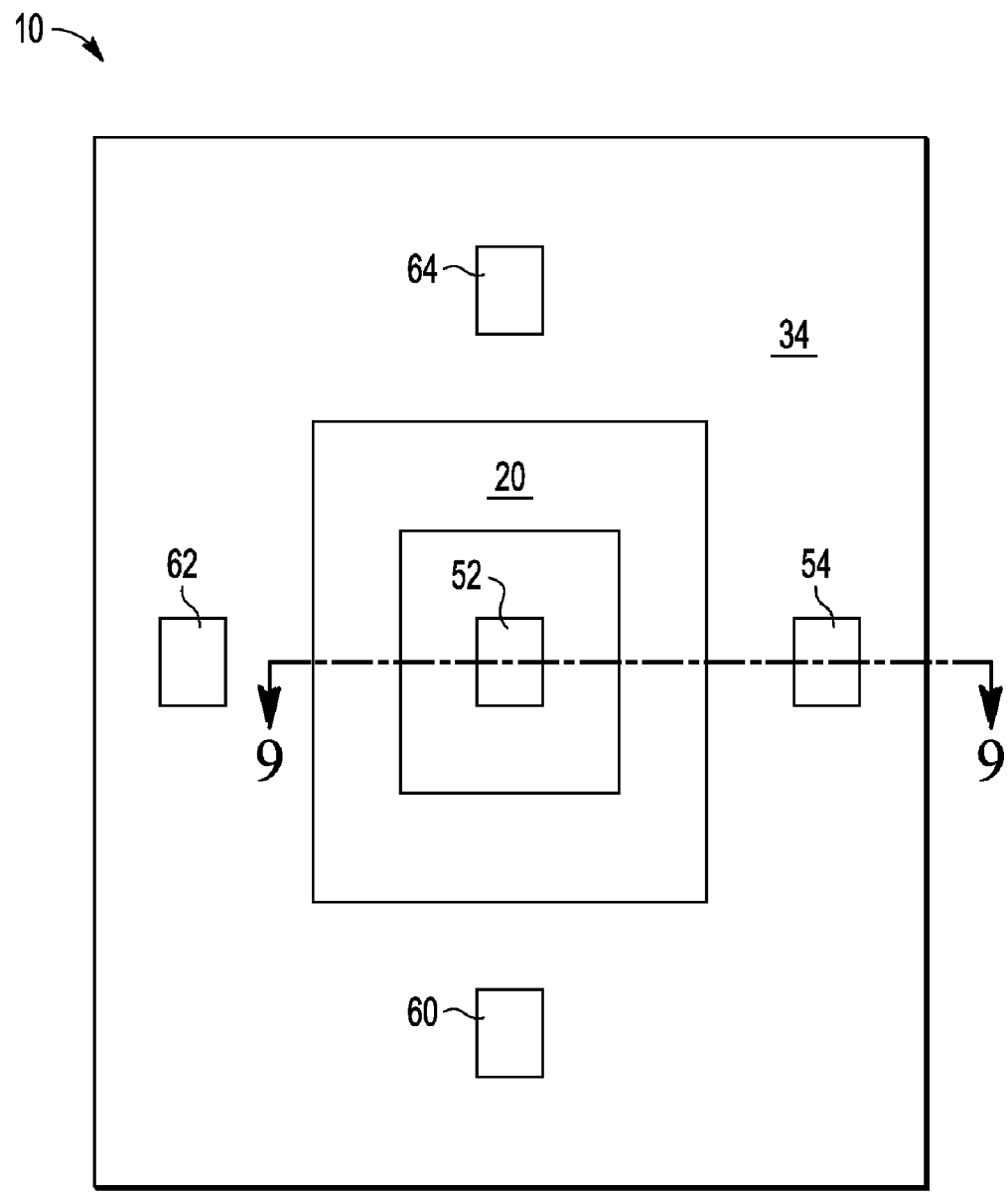
FIG. 10 illustrates a top down view of the semiconductor device in FIG. 9.

FIG. 10 illustrates a top down view of semiconductor device 10 in FIG. 9 with TEOS layer 26, silicon nitride 28, and ILD 36 removed to illustrate the points of interest. FIG. 10 illustrates contact plug 52 for electrically connecting to the metal-semiconductor Schottky contact 50 (not shown in FIG. 10) surrounded by trench 20. Ohmic contact 54 and additional Ohmic contacts 60, 62, and 64 make electrically contact with silicide 34 in Ohmic contact region 17. Note that contacts 52, 54, 60, 62, and 64 are rectangular in FIG. 10; Ohmic contacts 52, 54, 60, 62, and 64 may be circular in other embodiments or become circular in process due to well known photolithography-based rounding of sharp corners.

Forming the metal-semiconductor Schottky contact using a contact process instead of a silicide process results in a smaller area Schottky contact, thus resulting in a Schottky diode for operating at a higher frequency. Using the Schottky diode in high frequency (30-300 GHz) applications instead of conventional MOS transistors results in less noise at higher operating frequencies. Also, the use of a contact mask and process enables the smallest possible Schottky contact for a currently available CMOS process technology without added cost or complexity.

In one embodiment, a Schottky diode may be formed with Schottky contact well region 15 and Ohmic contact well region 17 separated by layers 24, 26, and 28 instead of trenches 20. In another embodiment, well regions 15 and 17 are separated by at least layer 24 and gate material of an MOS transistor. Also, in another embodiment, SIBL layer 18 is not used.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a metal-semiconductor Schottky contact in a well region, the method comprising:
   forming shallow trench isolation in the well region to form a first well region separated from a second well region by the shallow trench isolation;
   forming a first insulating layer overlying the shallow trench isolation, the first well region, and the second well region;
   removing a portion of the first insulating layer such that only the first well region and a portion of the shallow trench isolation is covered by a remaining portion of the first insulating layer;
   forming a highly doped region in the second well region;
   siliciding a top portion of the highly doped region to form a silicide layer;
   forming a second insulating layer overlying the remaining portion of the first insulating layer and the silicide layer;
   using a contact mask, forming a contact opening in the second insulating layer and the remaining portion of the first insulating layer to expose a portion of the first well region; and
   forming the metal-semiconductor Schottky contact in the exposed portion of the first well region by forming a metal layer in at least a portion of the contact opening and annealing the metal layer.

2. The method of claim 1, wherein the metal-semiconductor Schottky contact opening has a first area and the first well region has a second area, and wherein the first area is smaller than the second area.

3. The method of claim 1 further comprising:
   prior to forming the first insulating layer, forming a gate dielectric layer overlying the first well region and the second well region;
   removing a portion of the gate dielectric layer such that only the first well region and the portion of the shallow trench isolation is covered by a remaining portion of the gate dielectric layer; and
   using the contact mask, forming the contact opening in the gate dielectric layer to expose the portion of the first well region.

4. The method of claim 1 further comprising:
   using the contact mask, forming a second contact opening in the second insulating layer to expose a portion of the silicide layer.

5. The method of claim 1 further comprising:
   forming a contact plug in the contact opening by filling the contact opening with a conductive material.

6. The method of claim 1, wherein the metal layer comprises titanium and wherein the step of forming the metal-semiconductor Schottky contact comprises one of collimated sputtering or ionized metal plasma deposition process to form the metal layer in the contact opening.

7. The method of claim 1 further comprising:
   prior to siliciding the top portion of the highly doped region, annealing the second well region.

8. A method for forming a Schottky diode in a well region, the method comprising:
   forming shallow trench isolation in the well region to form a first well region separated from a second well region by the shallow trench isolation;
   forming a gate dielectric layer overlying the first well region and second well region;
   forming a first insulating layer overlying the gate dielectric layer;
   removing a portion of the first insulating layer and a portion of the gate dielectric layer such that only the first well region and a portion of the shallow trench isolation is covered by a remaining portion of the first insulating layer and a remaining portion of the gate dielectric layer;
   forming a highly doped region in the second well region;
   siliciding a top portion of the highly doped region to form a silicide layer;
   forming a second insulating layer overlying the remaining portion of the first insulating layer and the silicide layer;
   using a contact mask, forming a contact opening in the second insulating layer, the remaining portion of the first insulating layer, and the remaining portion of the gate dielectric layer to expose a portion of the first well region;
   forming a metal-semiconductor Schottky contact in the exposed portion of the first well region by forming a metal layer in at least a portion of the contact opening and annealing the metal layer such that the Schottky diode is formed with the metal-semiconductor Schottky contact as an anode and the highly doped region as a cathode.

9. The method of claim 8, wherein the metal-semiconductor Schottky contact has a first area and the first well region has a second area, and wherein the first area is smaller than the second area.

10. The method of claim 8 further comprising:
    using the contact mask, forming a second contact opening in the second insulating layer to expose a portion of the silicide layer.

11. The method of claim 8 further comprising:
    forming a contact plug in the contact opening by filling the contact opening with a conductive material.

12. The method of claim 8, wherein the metal layer comprises titanium and wherein the step of forming the metal-semiconductor Schottky contact comprises using one of collimated sputtering or ionized metal plasma deposition to form the metal layer in the contact opening.

13. The method of claim 8 further comprising:
    prior to siliciding the top portion of the highly doped region, annealing the second well region.

14. A method for forming a titanium-silicon Schottky contact in a well region, wherein the well region comprises silicon, the method comprising:
    forming shallow trench isolation in the well region to form a first well region separated from a second well region by the shallow trench isolation;
    forming a first insulating layer overlying the shallow trench isolation, the first well region, and the second well region;
    removing a portion of the first insulating layer such that only the first well region and a portion of the shallow trench isolation is covered by a remaining portion of the first insulating layer;
    forming a highly doped region in the second well region;
    siliciding a top portion of the highly doped region to form a silicide layer;
    forming a second insulating layer overlying the remaining portion of the first insulating layer and the silicide layer;
    using a contact mask, forming a contact opening in the second insulating layer and the remaining portion of the first insulating layer to expose a portion of the first well region; and
    forming the titanium-silicon Schottky contact in the exposed portion of the first well region by using a titanium layer and a titanium-nitride layer in at least a portion of the contact opening and annealing the titanium layer and the titanium-nitride at a predetermined temperature for at least a predetermined duration selected to obtain a low resistance at the titanium-silicon Schottky contact.

15. The method of claim 14, wherein the titanium-silicon Schottky contact has a first area and the first well region has a second area, and wherein the first area is smaller than the second area.

16. The method of claim 14 further comprising:
prior to forming the first insulating layer, forming a gate dielectric layer overlying the first well region and the second well region;
removing a portion of the gate dielectric layer such that only the first well region and the portion of the shallow trench isolation is covered by a remaining portion of the gate dielectric layer; and
using the contact mask, forming the contact opening in the gate dielectric layer to expose the portion of the first well region.

17. The method of claim 14 further comprising:
using the contact mask, forming a second contact opening in the second insulating layer to expose a portion of the silicide layer.

18. The method of claim 14 further comprising:
forming a contact plug in the contact opening by filling the contact opening with a conductive material.

19. The method of claim 14, wherein the step of forming the titanium-silicon Schottky contact comprises using one of collimated sputtering or ionized metal plasma deposition to form the titanium layer in the contact opening.

20. The method of claim 14 further comprising:
prior to siliciding the top portion of the highly doped region, annealing the second well region.

* * * * *